(12) United States Patent
Schoellkopf

(10) Patent No.: US 6,304,480 B1
(45) Date of Patent: Oct. 16, 2001

(54) READ ONLY MEMORY INTEGRATED SEMICONDUCTOR DEVICE

(75) Inventor: Jean-Pierre Schoellkopf, Grenoble (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/591,885

(22) Filed: Jun. 9, 2000

(30) Foreign Application Priority Data

Jun. 11, 1999 (FR) .................................................. 99 07429

(51) Int. Cl.$^7$ .................................................. G11C 17/14
(52) U.S. Cl. .................... 365/104; 365/103; 365/72; 365/63; 365/51; 365/168; 365/189.08
(58) Field of Search .................................. 365/103, 104, 365/63, 72, 51, 168, 189.08, 189.02

(56) References Cited

U.S. PATENT DOCUMENTS 5,289,406 * 2/1994 Uramoto et al. ..................... 365/104
5,771,208 6/1998 Iwase et al. .......................... 365/168

FOREIGN PATENT DOCUMENTS

| 41 27 549 | 3/1992 | (DE) | ............................... G11C/17/00 |
| 04276659 | 10/1992 | (JP) | ............................... H01L/27/112 |
| 08064695 | 3/1996 | (JP) | ............................... H01L/21/8246 |

* cited by examiner

Primary Examiner—Andrew Q. Tran
(74) Attorney, Agent, or Firm—Lisa K. Jorgenson; Allen Dyer, Doppelt, Milbrath & Gilchrist, P.A.

(57) ABSTRACT

A read only memory integrated semiconductor device includes at least one memory cell. The memory cell includes a storage transistor made within a semiconductor substrate and whose source is connected to ground. A word line is connected to the gate of the transistor. Only one of several bit lines may be connected to the drain of the transistor at a time.

27 Claims, 5 Drawing Sheets

READ ONLY MEMORY INTEGRATED SEMICONDUCTOR DEVICE

FIELD OF THE INVENTION

The invention relates to digital storage devices, and, more particularly, to read only memories (ROMs).

BACKGROUND OF THE INVENTION

Conventional read only memories include a network of elementary memory cells (or memory points) arranged in lines (or rows) and columns. All the memory cells in a line are activated by a first metallization or connection (i.e., a word line), while all the cells in a column can be read based on the voltage across the terminals of a column's connection or bit lines. That is, the activation of a word line and the measurement of the voltage across the terminals of a bit line make it possible to read the content of the memory cell situated at the intersection of the word line and the bit line. The value of the information stored depends on the level (high or low) of the voltage on the bit line. Accordingly, with a conventional read only memory cell it is only possible to code or store a digital word of one bit (which can be zero or one).

SUMMARY OF THE INVENTION

One object of the invention is to provide a read only memory integrated device offering a greater storage density by allowing more than one bit per memory cell.

Another object of the invention is to provide increased reading speed for each cell.

Yet another object of the invention is to provide a read only memory integrated circuit device with cells that can store words of several bits (for example, four bits) and has a reduced size relative to the read only memory devices of the prior art previously required to store several bits.

These and other objects, features, and advantages in accordance with the present invention are provided by a read only memory integrated semiconductor device including at least one memory cell comprising a storage transistor formed within a semiconductor substrate and whose source is grounded, a first connection line (word line) connected to the gate of the transistor, and at least two auxiliary connection lines (bit lines), only one of which may be linked to the drain of the transistor at a time.

In other words, rather than a single bit line, at least two bit lines are associated with each memory cell. Also, to avoid a short-circuit between the bit lines, only a single bit line may be connected to the drain of the transistor at a time. This makes it possible to store more than two values per memory cell; for example, four values for three bit lines forming a digital word of two bits may be stored. The choice of the bit line to be linked to the drain of the transistor depends on the value of the binary information to be stored or written into the memory cell during its fabrication. Of course, it is also possible not to link any of the bit lines to the drain of the transistor, thus making it possible to store a particular value of the digital word contained in the memory cell.

The auxiliary connection lines (bit lines) can be parallel and situated one above another respectively at different metallization levels above the semiconductor substrate. Multi-level memory cells are thus obtained.

Apart from increasing the storage density, the present invention makes it possible to make storage transistors of greater size, thus allowing faster reading of the content of the selected memory cell. Furthermore, the auxiliary connection lines may be parallel and situated alongside one another on the same metallization level.

BRIEF DESCRIPTION OF THE DRAWINGS

Other advantages and characteristics of the invention will become apparent upon examining the detailed description of the embodiments, which are in no way limiting, and of the appended drawings, in which.

DETAILED DESCRIPTION OF THE PREFERRED EMBODIMENTS

Figure 1:
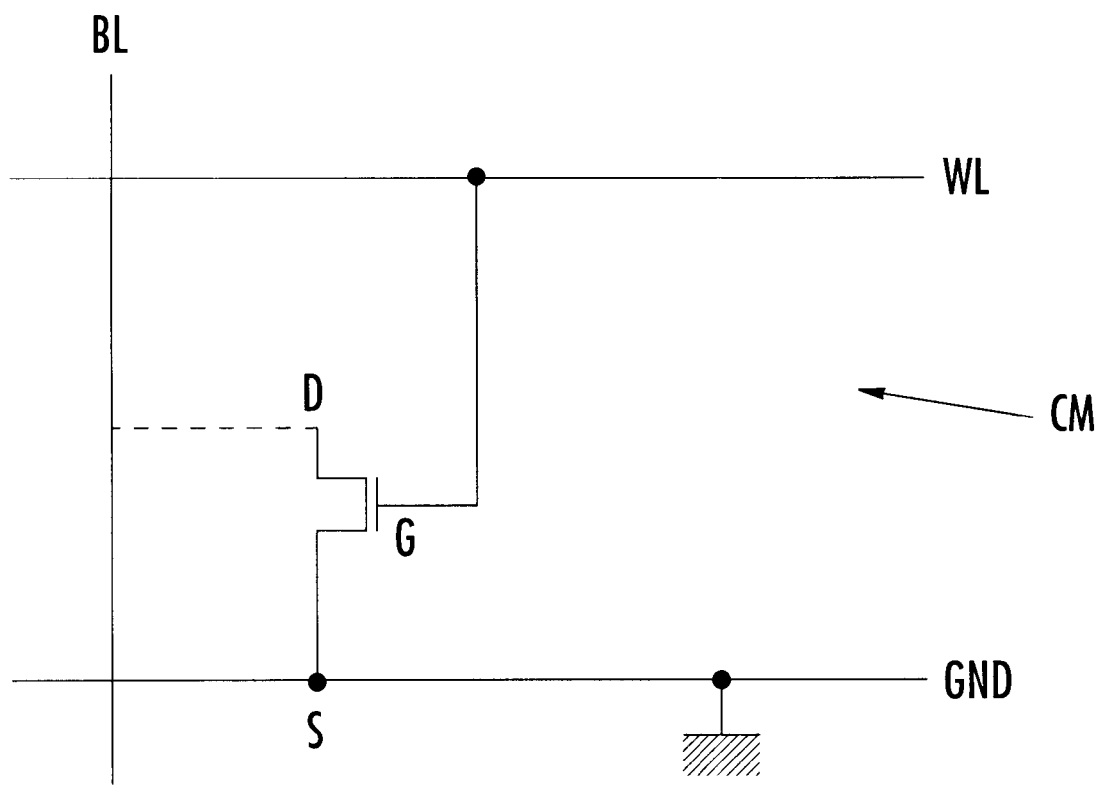
FIG. 1 is a schematic diagram illustrating the principle of operation of a read only memory cell as in the prior art, which principle is also applicable to the memory cells according to the invention.

Turning now to FIG. 1, the reference CM denotes a read only memory cell including a storage transistor T whose source S is linked to a grounded connection GND. The gate of the storage transistor T is linked to a first connection WL, commonly referred to as a "word line" by those of skill in the art.

For simplicity, only a single bit line BL is illustrated in FIG. 1 (BL is also referred to as "auxiliary connection" herein to distinguish it from the first connection, i.e., the word line). Accordingly, the principle of reading which will now be described with reference to FIG. 1 also applies to the memory cells according to the invention which are associated with several bit lines, only one of which may be linked to the drain of the storage transistor.

During fabrication of the memory cell CM within an integrated circuit, the bit line BL is linked, if at all, to the drain of the storage transistor. This influences the value of the information stored in the memory cell CM. Also, when reading the memory cell, the bit line BL is precharged in a conventional manner with a supply voltage Vdd. When the word line WL is activated (by applying, for example, the supply voltage thereto), the transistor T is on. As a consequence, if the bit line BL is linked to the drain of the transistor T, this line will discharge and the voltage across the terminals of the bit line BL will drop low. On the other hand, if the bit line BL is not linked to the drain of the transistor, the bit line will not discharge and the voltage across the terminals of the bit line will remain at its nominal value Vdd (less any leakage). The binary value 1, for example, is then assigned when the voltage of the bit line BL remains equal to the supply voltage Vdd, whereas the binary value 0 is assigned when the bit line B1 discharges.

Figure 2:
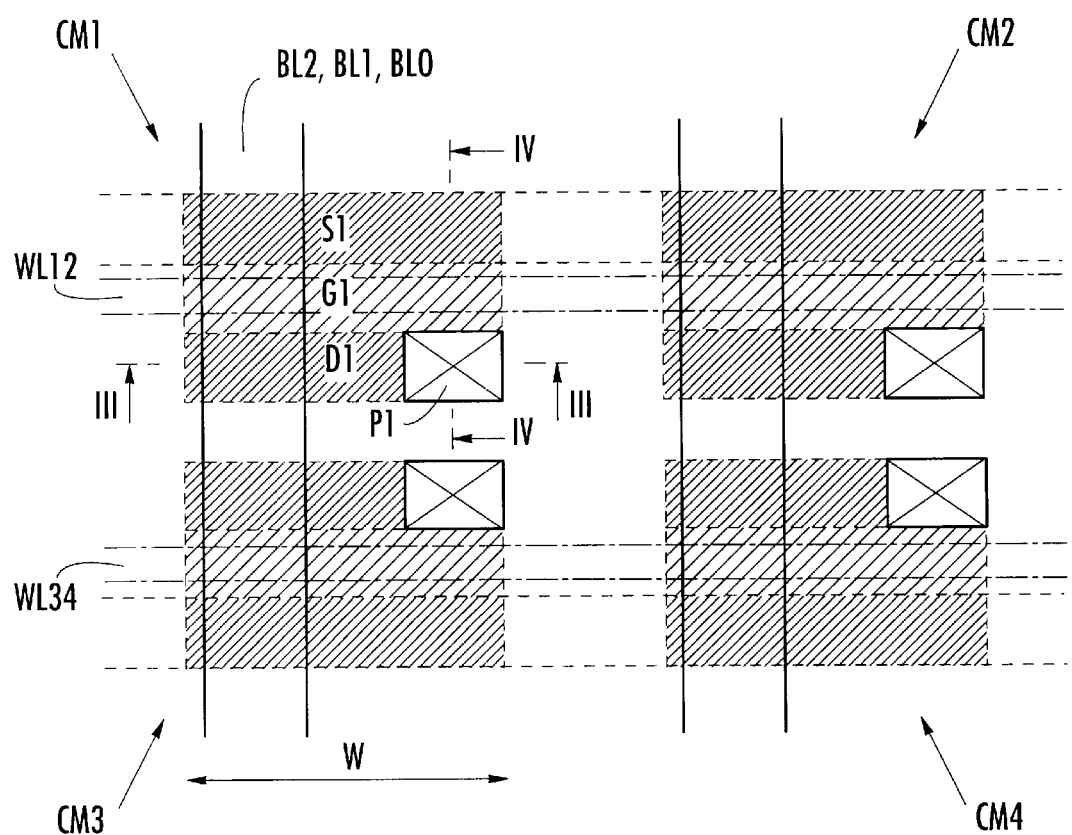
FIGS. 2 through 4 are schematic diagrams partially illustrating a first embodiment of a read only memory integrated device according to the invention, in which each read only memory cell is associated with three bit lines.

In FIG. 2, the references CM1, CM2, CM3 and CM4 denote four memory cells belonging to a memory plane of an integrated memory device according to the invention.

Figure 4:
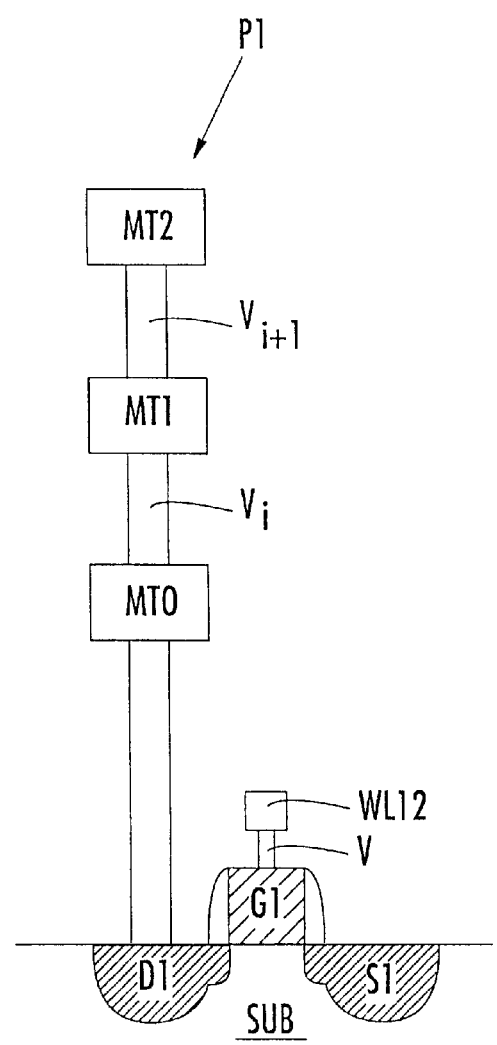

Each memory cell (for example, the cell CM1) includes a storage transistor within a semiconductor substrate made in a conventional manner known to those of skill in the art. The storage transistor includes a source zone Sl, a drain zone D1, and a gate zone G1. The configuration of this storage transistor is also illustrated in FIG. 4, which shows a partial cross-sectional view along the line IV—IV of FIG. 2. The sources of the transistors of the same line are grounded together.

A first word line or connection WL12 is linked to all the gates of the storage transistors of the memory cells on the same line of the memory plane. The word line WL12 is consequently linked to the gate G1 of the storage transistor of the memory cell CM1. This may be done through a metal interconnection V (see FIG. 4) known as a "via" or "contact," as will be appreciated by those of skill in the art.

Figure 3:
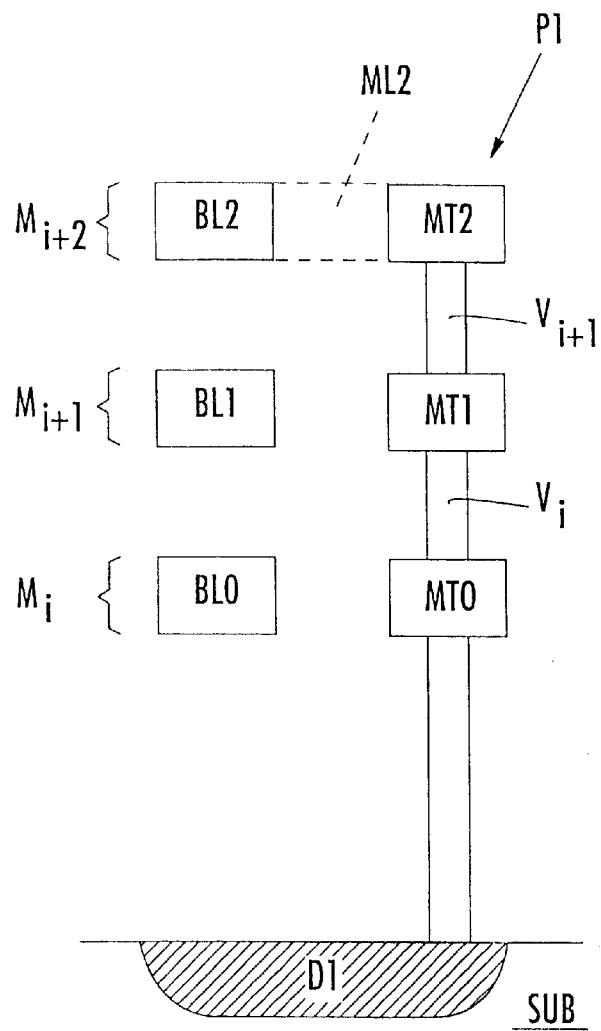

Furthermore, as illustrated more particularly in FIG. 3 which shows a cross-sectional view taken along the line III—III of FIG. 2, the memory cell CM1 is associated with several auxiliary connections or bit lines (here three), BL0, BL1 and BL2. These bit lines BL0, BL1 and BL2 extend in a direction perpendicular to the word lines and define a column of the memory plane. Also, all the memory cells of this column are associated with these three bit lines, which in this instance are the memory cells CM1 and CM3. In this embodiment, the bit lines BL0, BL1 and BL2 are parallel and situated one above another, respectively, at different metallization levels above the semiconductor substrate SUB. They are made respectively at the metallization levels $M_i$, $M_{i+1}$ and $M_{i+2}$.

The memory cell CM1 also includes a vertical metal means of connection, or metal pillar P1, having a first end in contact with the drain D1 of the storage transistor of the cell. The metal pillar P1 extends vertically from the substrate SUB and perpendicularly to the various metallization levels. The pillar P1 comprises metal portions MT0, MT1, and MT2 respectively situated at the metallization levels $M_i$, $M_{i+1}$ and $M_{i+2}$. The metal portions MT1 and MT2 are mutually connected by a via $V_{i+1}$, while the metal portions MT1 and MT0 are mutually connected by a via $V_i$. The metal portion MT0 is also connected by another via to the drain D1 of the transistor.

Depending upon the value of the digital information to be stored in the memory cell CM1, only one of the bit lines BL0, BL1, BL2 (or none of them) will be linked to the pillar P1 during the fabrication process. During the fabrication process the memory cell is programmed, which requires three masks for the three metallization levels $M_i$, $M_{i+1}$ and $M_{i+2}$. In the embodiment illustrated in FIGS. 2 through 4, the bit line BL2 is linked to the pillar P1 by a horizontal connection ML2.

Assuming that a logic 1 value is associated with a bit line not connected to the pillar P1 and that a logic 0 value is associated with a bit line connected to the pillar P1, the memory cell CM1 illustrated in FIG. 3 therefore stores the value 011 (respectively associated with the bit lines BL2, BL1 and BL0). This value will be read upon activation of the cell CM1. Once the three bit lines BL0, BL1 and BL2 have been precharged to the supply voltage Vdd and the word line WL12 has been activated, only the bit line BL2 will discharge. A low voltage level will be measured on the bit line BL2 corresponding to the value 0, and a high voltage level will be measured on the lines BL0 and BL1 corresponding to the values 1 and 1.

In addition to the programming illustrated in FIG. 3, three other programming configurations are possible. These are the programming of the value 111 when none of the bit lines BL0, BL1 and BL2 are connected to the pillar P1, the value 101 when only the bit line BL1 is connected to the pillar, or the value 110 when only the bit line BL0 is connected to the pillar.

Figure 5:
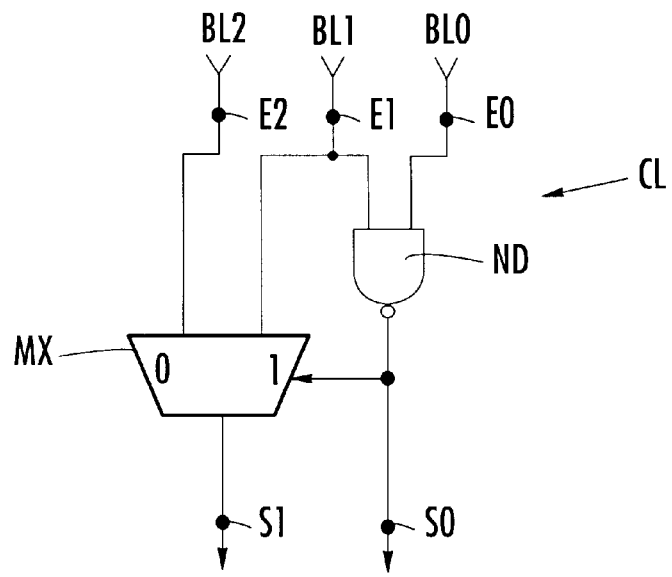
FIG. 5 is a schematic diagram illustrating a logic circuit which can be connected to a read only memory cell according to the present invention with three bit lines to allow the output of a digital word stored on two bits and representative of the content of the information stored in the memory cell.

A conversion logic circuit CL may be associated with the memory plane by way of a multiplexer (and correspondingly with memory cell CM1), as shown in FIG. 5. It is therefore possible to convert the value stored in the cell CM1 and taken from among the four possible storage values into a two bit digital output word. The conversion logic circuit CL has three inputs E2, E1, E0, each of which is respectively connected to the three bit lines BL2, BL1, and BL0 of the memory cell CM1, and two outputs S1, S0 delivering the two bits of the output word.

A logic means or circuit is connected between the three inputs E2, E1, E0 and the two outputs S0, S0 to perform the conversion. The logic means includes, for example, a NAND logic gate ND, whose two inputs are respectively connected to the two inputs E0 and E1 of the conversion logic circuit, and whose output is connected to the output S0 of the conversion logic circuit. The logic means also includes a multiplexer MX whose two inputs are respectively connected to the inputs E1 and E2 of the logic circuit and whose output is connected to the other output S1 of the conversion logic circuit. The control input of the multiplexer MX is connected to the output of the logic gate ND. The three inputs E0, E1 and E2 are respectively connected to the three bit lines BL0, BL1 and BL2.

Thus, the stored logic value 110, respectively delivered to the inputs E2, E1 and E0, will yield as an output the value 11 for an output word of two bits. Likewise, the stored value 111 will yield as an output the value 10 for the output word, the stored value 101 will yield the value 01 for the output word, and the stored value 011 will yield the value 00 for the output word.

Those of skill in the art will appreciate that the memory cell according to the present invention makes it possible to code a digital word of two bits using three bit lines. A storage density of two bits per column, i.e., two bits per memory cell, is therefore achieved.

Additionally, since the stack of bit lines is situated alongside the metal pillar P1, the width W of the transistor (see FIG. 2) can be greater than that of a transistor of a conventional memory cell including only a single bit line where the width is equal to that of the bit line. Consequently, the reading speed for such a memory cell according to the invention is greater.

When a memory cell according to the invention is associated with two bit lines, it is then possible to store three values. The value 11 is stored when none of the bit lines connected to the metal pillar P1 (i.e., the drain of the storage transistor). Likewise, the value 01 or 10 is stored when one or the other of the two bit lines is connected to the drain of the storage transistor. These three possible storage values form a ternary digit.

If two memory cells are each associated with two bit lines (for example, if two memory cells of two adjacent columns are associated), it is thus possible to store nine values with the aid of these two ternary digits. From among these nine values it is then possible to choose eight to produce an output word coded on three bits and an assigned a validity bit. The nine possible values stored by this pair of two memory cells are represented in the corresponding first four columns of Table 1 below, where the references BL1A and BL2A denote the two bit lines of one of the two memory cells, and BL1B and BL2B denote the two counterpart bit lines of the other memory cell.

TABLE 1

| BL1A | BL2A | BL1B | BL2B | Output word | S4 |
|------|------|------|------|-------------|----|
| 1 | 1 | 1 | 1 | 000 | 0 |
| 1 | 1 | 1 | 0 | 001 | 0 |
| 1 | 1 | 0 | 1 | 010 | 0 |
| 1 | 0 | 1 | 1 | 011 | 0 |
| 1 | 0 | 1 | 0 | 100 | 0 |
| 1 | 0 | 0 | 1 | 101 | 0 |
| 0 | 1 | 1 | 1 | 110 | 0 |
| 0 | 1 | 1 | 0 | 111 | 0 |
| 0 | 1 | 0 | 1 | 000 | 1 |

Figure 6:
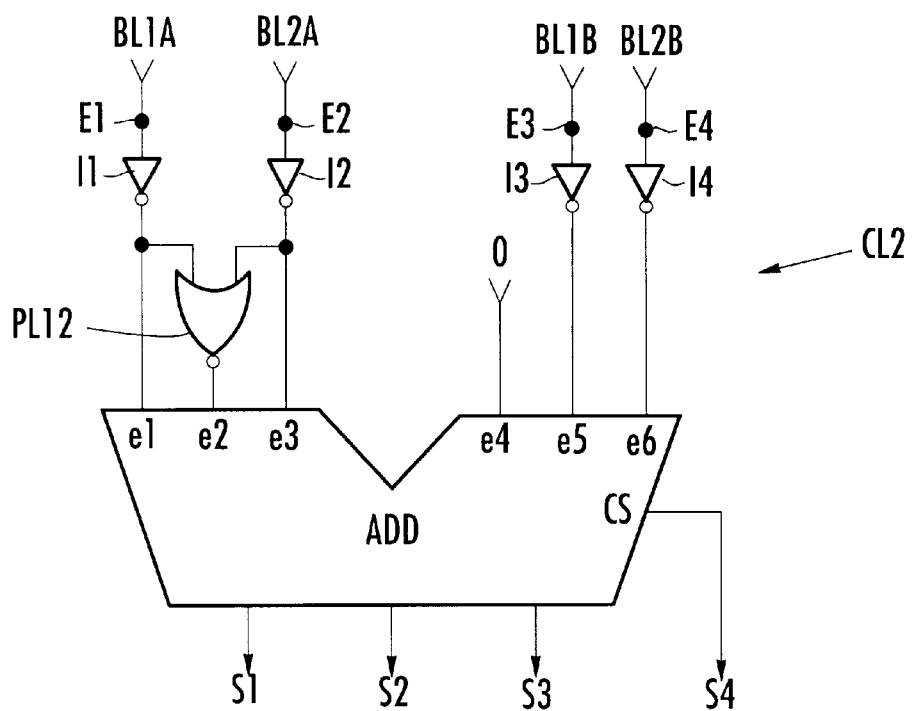
FIG. 6 is a schematic diagram of another logic circuit for converting ternary logic into binary logic, and which can be used in combination with a pair of memory cells according to the invention each associated with two bit lines.

The four bit lines BL1A, BL2A, BL1B and BL2B are respectively connected to the four inputs E1, E2, E3, and E4 of a ternary/binary conversion circuit CL2, as illustrated in FIG. 6. The ternary/binary conversion circuit CL2 has four outputs S1, S2, S3, and S4 and a conversion logic means or circuit connected between the four inputs BL1A, BL2A, BL1B, and BL2B and the four outputs. The conversion logic means converts the value stored in the two cells and taken from among the nine possible storage values into an output word stored on three bits S1, S2, S3, and an assigned check bit S4.

The conversion logic means includes, for example, a NOR logic gate PL12 and a 3-bit binary adder ADD. The binary adder ADD has three outputs connected to the three outputs S1, S2, S3 to deliver the output word, and a carry output CS connected to the fourth output S4 to deliver the check bit. The first input e1 of the adder ADD is connected to the input E1 by an inverter I1, and the third input e3 of the adder ADD is connected to the input E2 by an inverter I2. The outputs of the two inverters I1 and I2 are connected to the two inputs of the NOR logic gate PL12, whose output is connected to the second input e2 of the adder ADD.

The fourth input e4 of the adder ADD is hard-wired to a logic zero value or ground. The fifth and sixth inputs e5 and e6 of the adder ADD are respectively linked to the inputs E3 and E4 of the ternary/binary conversion circuit CL2 by inverters I3 and I4. Thus, the nine possible values of the output word stored on three bits are provided in the fifth column of Table 1, while the last column of the table indicates the value of the carry bit S4 for each of the output words.

Those of skill in the art will appreciate that the first eight possible values stored in the two memory cells lead to the eight possible values of the output word of three bits. Each value is assigned a carry equal to 0, while the ninth possible storage value (see the last row of Table 1) leads to an output word of three bits equal to 000 that is assigned a carry equal to 1.

The use of the carry bit S4 makes it possible to validate the content of the information stored in the pair of memory cells being addressed. That is, the information is valid when the carry is equal to 0 and invalid if the carry is equal to 1. Software may be used to program pairs of memory cells situated at predetermined addresses and having a prohibited configuration of 0101 that prohibits access to a processor. If, while the software is running, the carry bit S4 switches to 1 upon reading a pair of memory cells, this will signify that the processor has attempted to read information at a prohibited address.

The use of two coupled memory cells each having two bit lines makes it possible to obtain a storage density of three bits for two cells (i.e., three bits for two columns). In other words, a storage density of 1.5 bits per cell is possible along with an indication regarding the validity of the information being read.

Those of skill in the art will appreciate that the ternary/binary conversion logic circuit CL2 may be used independently of the above-described read only memory application in general applications for converting ternary logic into binary logic. Another advantage of the ternary/binary conversion circuit CL2 is that it is relatively simple to implement regardless of the application.

Figure 7:
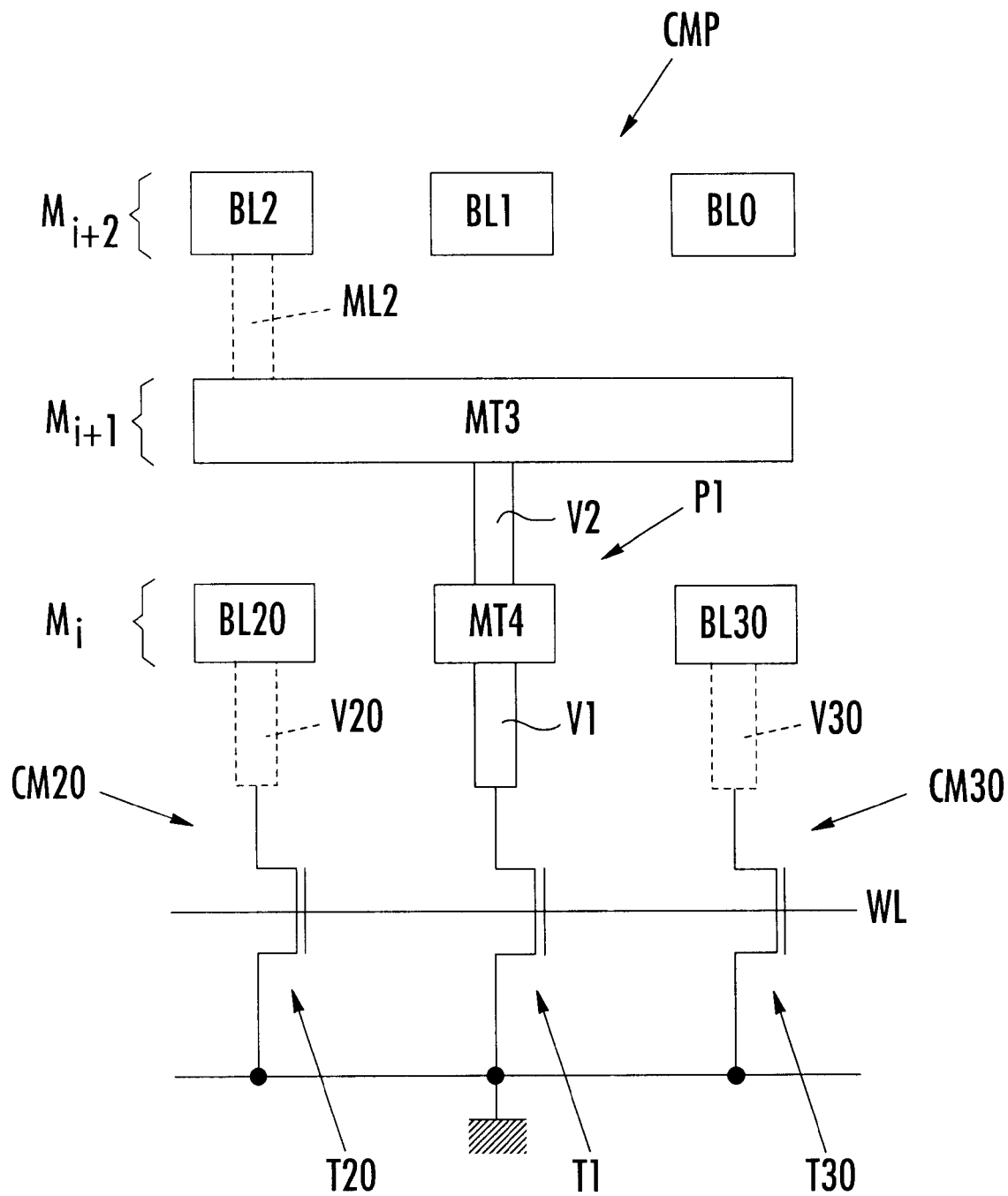
FIG. 7 illustrates another embodiment of a memory cell according to the invention.

Referring now to FIG. 7, another embodiment of the invention is illustrated which includes a memory cell CMP having three bit lines BL0, BL1 and BL2. The bit lines BL0, BL1 and BL2 are parallel and situated alongside one another on the same upper metallization level $M_{i+2}$, which in turn is situated above the semiconductor substrate (not shown). Here again, only one of the bit lines BL0, BL1 and BL2 may be connected to the storage transistor T1 of the memory cell CMP at a time.

The memory cell CMP includes an intermediate connection line MT3 situated at an intermediate metallization level $M_{i+1}$ between the substrate and the upper level $M_{i+2}$. A vertical metal pillar P1 has a first end in contact with the drain of the transistor T1 and a second end in contact with the intermediate connection line MT3. The vertical metal pillar P1 includes a via V2 connecting the intermediate connection line MT3 to a metal portion MT4 situated at the lower metallization level $M_i$. The vertical metal pillar P1 also includes a via V1 linking the metal portion MT4 to the drain of the transistor T1. One of the bit lines BL0, BL1 or BL2 may optionally be linked to the drain of the transistor T1 during programming of the memory cell CMP. If this is the case, a connection is provided to connect the bit line (for example, BL2) to the intermediate connection line MT3 through a vertical connection (a via) ML2.

It will be appreciated that a memory block is illustrated in FIG. 7, of which the memory cell CMP is the main memory cell. The memory block also includes three parallel bit lines BL0, BL1 and BL2, and two ancillary memory cells each comprising an ancillary storage transistor T20, T30. The two ancillary storage transistors T20 and T30, as well as the storage transistor T1 of the memory cell CMP, are all connected to the same word line WL. Furthermore, each ancillary memory cell includes a single ancillary connection line (bit line) BL20, BL30, which may be connected to the drain of the corresponding ancillary transistor depending upon the programming desired for each of the two ancillary memory cells CM20, CM30.

Each ancillary bit line BL20, BL30 is situated on either side of the metal pillar P1 at the same ancillary metallization level $M_i$, which is situated under the intermediate connection line MT3. Each ancillary bit line is situated under one of the bit lines of the main memory cell. In this embodiment, the bit line BL20 is situated under the bit line BL2, and the bit line BL30 is situated under the bit line BL0.

Those of skill in the art will appreciate that it is possible to store in the memory block including the cells CMP, CM20, CM30 sixteen different binary values (2×2×4). That is, two possible values for the ancillary memory cell CM20 are associated with the bit line BL20, two possible values for the ancillary memory cell CM30 are associated with the bit line BL30, and four possible values for the main memory cell CMP are associated with the three bit lines BL0, BL1 and BL2.

A conversion circuit (not shown for the sake of simplification) may be associated with the memory block.

Such a conversion circuit will include five inputs respectively connected to the three bit lines BL0, BL1 and BL2 of the main memory cell and to the two ancillary bit lines BL20 and BL30 of the two ancillary memory cells. The conversion circuit will also include four outputs and conversion logic means or circuit connected between the five inputs and the four outputs. The logic means is provided for converting the value stored in the memory block and taken from among the sixteen possible storage values into a four bit output word. Such conversion logic means may readily be made by those of skill in the art.

Thus, this embodiment makes it possible to code a word of four bits using three metallization columns. In other words, sixteen values (or four bits) may be coded on three tracks, which provides a density of four thirds of a bit per metal track, whereas a memory plane of the prior art would have required the use of four adjacent columns (hence four metal tracks).

That which is claimed is:

1. An integrated read only memory device comprising:
    at least one memory cell comprising
        a semiconductor substrate,
        a storage transistor in said semiconductor substrate and having a first conduction terminal connected to a reference voltage,
        a word line connected to a control terminal of said storage transistor, and
        a plurality of auxiliary bit lines for connection to a second conduction terminal of said storage transistor, at most one of said plurality of auxiliary bit lines being connected to the second conduction terminal of said storage transistor at a time.

2. The integrated read only memory device according to claim 1 wherein said plurality of auxiliary bit lines are situated one above another on respective metallization levels above said semiconductor substrate.

3. The integrated read only memory device according to claim 2 wherein said at least one memory cell further comprises a pillar connecting the second conduction terminal of said storage transistor to each of the metallization levels.

4. The integrated read only memory device according to claim 3 further comprising a horizontal connection connecting at most one of said plurality of auxiliary bit lines to said pillar.

5. The integrated read only memory device according to claim 3 wherein said pillar comprises metal.

6. The integrated read only memory device according to claim 1 wherein said plurality of auxiliary bit lines comprises three auxiliary bit lines; and further comprising a conversion circuit comprising:
    three inputs respectively connected to said three auxiliary bit lines;
    two outputs; and
    a logic circuit connected between the three inputs and the two outputs for converting a value stored in said at least one memory cell into a two bit output word.

7. The integrated read only memory device according to claim 1 wherein said at least one memory cell comprises two memory cells; wherein said plurality of auxiliary bit lines comprises two auxiliary bit lines; and further comprising a ternary/binary conversion circuit comprising:
    four inputs respectively connected to each of said two auxiliary bit lines of said two memory cells;
    four outputs; and
    a conversion logic circuit connected between said four inputs and said four outputs for converting a value stored in said two memory cells into a three bit output word and a check bit.

8. The integrated read only memory device according to claim 7 wherein said conversion logic circuit comprises:
    a NOR logic gate; and
    a 3-bit binary adder having three outputs connected to three of said four outputs to provide the three bit output word and a carry output connected to the other of said four outputs to provide the check bit.

9. The integrated read only memory device according to claim 1 wherein said plurality of auxiliary bit lines are alongside one another on a predetermined metallization level.

10. The integrated read only memory device according to claim 9 wherein the at least one memory cell further comprises:
    a connection line situated at an intermediate metallization level between said semiconductor substrate and the predetermined metallization level; and
    a pillar having a first end connected to the second conduction terminal of said storage transistor and a second end connected to said connection line.

11. The integrated read only memory device according to claim 10 wherein said pillar comprises metal.

12. The integrated read only memory device according to claim 10 further comprising a vertical connection connecting at most one of said plurality of auxiliary bit lines to said connection line.

13. The integrated read only memory device according to claim 1 wherein said storage transistor comprises a MOS transistor, wherein the first conduction terminal comprises a source of said MOS transistor, wherein the second conduction terminal comprises a drain of said MOS transistor, and wherein the control terminal comprises a gate of said MOS transistor.

14. An integrated read only memory device comprising:
    at least one memory cell comprising
        a semiconductor substrate,
        a storage transistor in said semiconductor substrate and having a first conduction terminal connected to a reference voltage,
        a word line connected to a control terminal of said storage transistor,
        a plurality of auxiliary bit lines, situated one above another on respective metallization levels above the semiconductor substrate, for connection to a second conduction terminal of said storage transistor, at most one of said plurality of auxiliary bit lines being connected to the second conduction terminal of said storage transistor at a time, and
        a pillar connecting the second conduction terminal of said storage transistor to each of the metallization levels.

15. The integrated read only memory device according to claim 14 further comprising a horizontal connection connecting at most one of said plurality of auxiliary bit lines to said pillar.

16. The integrated read only memory device according to claim 14 wherein said pillar comprises metal.

17. The integrated read only memory device according to claim 14 wherein said storage transistor comprises a MOS transistor, wherein the first conduction terminal comprises a source of said MOS transistor, wherein the second conduction terminal comprises a drain of said MOS transistor, and wherein the control terminal comprises a gate of said MOS transistor.

18. An integrated read only memory device comprising:
   at least one memory cell comprising
      a semiconductor substrate,
      a storage transistor in said semiconductor substrate and having a first conduction terminal connected to a reference voltage,
      a word line connected to a control terminal of said storage transistor, and
      a plurality of auxiliary bit lines, each alongside one another on a predetermined metallization level, for connection to a second conduction terminal of said storage transistor, at most one of said plurality of auxiliary bit lines being connected to the second conduction terminal of said storage transistor at a time,
      a connection line situated at an intermediate metallization level between said semiconductor substrate and the predetermined metallization level, and
      a pillar having a first end connected to the second conduction terminal of said storage transistor and a second end connected to said connection line.

19. The integrated read only memory device according to claim 18 wherein said pillar comprises metal.

20. The integrated read only memory device according to claim 18 further comprising a vertical connection connecting at most one of said plurality of auxiliary bit lines to said connection line.

21. The integrated read only memory device according to claim 18 wherein said storage transistor comprises a MOS transistor, wherein the first conduction terminal comprises a source of said MOS transistor, wherein the second conduction terminal comprises a drain of said MOS transistor, and wherein the control terminal comprises a gate of said MOS transistor.

22. A integrated read only memory device comprising:
   a memory block comprising
      a main memory cell comprising a semiconductor substrate, a storage transistor in said semiconductor substrate and having a first conduction terminal connected to a reference voltage, a word line connected to a control terminal of said storage transistor, and at least three auxiliary bit lines for connection to a second conduction terminal of said storage transistor, at most one of the at least three auxiliary bit lines being connected to the second conduction terminal of said storage transistor at a time; and
      a plurality of ancillary memory cells each comprising an ancillary storage transistor connected to the word line of said main memory cell and an ancillary bit line for connection to a conduction terminal of said ancillary storage transistor.

23. The integrated read only memory device according to claim 22 wherein said at least three auxiliary bit lines are situated alongside one another on a predetermined metallization level above said semiconductor substrate.

24. The integrated read only memory device according to claim 23 wherein said main memory cell further comprises:
   a connection line situated at an intermediate metallization level between said semiconductor substrate and the predetermined metallization level; and
   a pillar having a first end connected to the second conduction terminal of said storage transistor and a second end connected to said connection line.

25. The integrated read only memory device of claim 24 wherein said ancillary bit lines are situated on either side of said pillar on a lower metallization level situated under said connection line.

26. The integrated read only memory device of claim 25 wherein each ancillary bit line is situated under one of said at least three auxiliary bit lines of said main memory cell; wherein said plurality of ancillary memory cells comprises two ancillary memory cells; and wherein the integrated read only memory device further comprises a conversion circuit comprising:
   five inputs respectively connected to said at least three auxiliary bit lines and said two ancillary bit lines,
   four outputs, and
   a logic circuit connected between said five inputs and said four outputs for converting a value stored in said memory block into a four bit output word.

27. The integrated read only memory device according to claim 22 wherein said storage transistor comprises a MOS transistor, wherein the first conduction terminal comprises a source of said MOS transistor, wherein the second conduction terminal comprises a drain of said MOS transistor, and wherein the control terminal comprises a gate of said MOS transistor.

* * * * *